United States Patent
Woods et al.

(10) Patent No.: US 7,180,367 B2
(45) Date of Patent: Feb. 20, 2007

(54) SYSTEMS, METHODS AND DEVICES FOR DIFFERENTIAL ACTIVE BIAS OF MULTI-STAGE AMPLIFIERS

(75) Inventors: Charles Woods, Gilbert, AZ (US); Gauray Menon, Gilbert, AZ (US)

(73) Assignee: U.S. Monolithics, L.L.C., Chandler, AZ (US)

( * ) Notice: Subject to any disclaimer, the term of this patent is extended or adjusted under 35 U.S.C. 154(b) by 83 days.

(21) Appl. No.: 10/905,522

(22) Filed: Jan. 7, 2005

(65) Prior Publication Data

US 2006/0152280 A1 Jul. 13, 2006

(51) Int. Cl.
*H03G 3/30* (2006.01)

(52) U.S. Cl. .................. 330/133; 330/285
(58) Field of Classification Search ............ 330/133
See application file for complete search history.

(56) References Cited

U.S. PATENT DOCUMENTS

| | | | |
|---|---|---|---|
| 5,936,467 A | | 8/1999 | Strickland et al. |
| 6,101,373 A | * | 8/2000 | Samuels ............ 455/234.1 |
| 6,121,838 A | * | 9/2000 | Freeman et al. ......... 330/253 |
| 6,472,937 B1 | | 10/2002 | Gerard et al. |
| 6,549,076 B2 | * | 4/2003 | Kuriyama ............ 330/296 |
| 6,605,999 B2 | * | 8/2003 | Matsushita et al. ......... 330/285 |
| 6,744,321 B2 | * | 6/2004 | Noh et al. ............ 330/296 |
| 2003/0201827 A1 | | 10/2003 | Ohnishi et al. |
| 2005/0134376 A1 | | 6/2005 | Westwick et al. |

FOREIGN PATENT DOCUMENTS

GB  2269716  2/1994

* cited by examiner

*Primary Examiner*—Benny Lee
*Assistant Examiner*—Alan Wong
(74) *Attorney, Agent, or Firm*—Snell & Wilmer L.L.P.

(57) ABSTRACT

Systems, devices, and methods are provided for actively biasing a multi-stage amplifier. A method for differentially actively biasing a multi-stage amplifier comprises the steps of: actively biasing, with a single active bias circuit, an amplifier comprising a plurality of amplification stages; and differentially applying the bias provided by the single active bias circuit by biasing at least one amplification stage at a different bias level than another of the plurality of amplification stages. An active bias circuit for a multi-stage amplifier comprises: a single active bias circuit that is configured to actively bias a plurality of amplification stages via at least two gates; and a differential device configured to cause the active biasing provided to one gate to be different from the bias provided to another gate.

19 Claims, 3 Drawing Sheets

SYSTEMS, METHODS AND DEVICES FOR DIFFERENTIAL ACTIVE BIAS OF MULTI-STAGE AMPLIFIERS

FIELD OF INVENTION

The invention relates generally to systems, devices, and methods for actively biasing a multi-stage amplifier.

BACKGROUND OF INVENTION

An amplifier is typically used to amplify signals such as, for example, high frequency radio frequency ("RF") or microwave signals. Amplifiers may be multi-stage devices, where the input signal to be amplified passes through a series of amplification stages each comprising one or more relatively small amplifiers. Generally, each stage of the multi-stage amplifier steps up the amplification of the signal, such that the output signal of the amplifier has been appropriately amplified.

By way of example, in high-power amplifiers ("HAP's"), increasing the RF gain (i.e., the RF signal amplification) typically requires a number of amplification stages. Each amplification stage is typically powered by bias circuitry that provides a bias voltage and current to each stage. Processing variations, from lot to lot in the manufacture of amplifiers, may cause variations in the bias voltage and current provided to the amplification stages. In some circuits, small changes in the process of constructing the die at a wafer fabrication plant can result in drain current variation as between two die that are biased identically. Furthermore, changing the temperature of bias circuitry may cause the bias circuitry to bias an amplifier differently at different temperature levels.

Therefore, active bias circuits are used to at least partially compensate for these variations and to control the bias voltage substantially independent of these changes. Controlling the bias in this manner is known as active biasing.

Although active biasing is desirable, active biasing circuitry typically occupies a relatively large amount of space and increases the costs associated with building an amplifier circuit. Therefore, conventional wisdom has been that when active bias is provided, a single active bias circuit is used to provide a common active bias to all of the stages of the multi-stage amplifier. It is generally understood to be cost and space prohibitive to provide a separate active bias circuit for each amplifier stage.

Thus, typically, all of the amplification stages are actively biased together. In other words, the current to the whole die (i.e., all the amplification stages) is controlled by one active bias circuit. However, when a common bias is provided to all of the stages and a compression sweep is run on a multi-stage amplifier at least some of the stages may experience a certain amount of RF gain expansion and/or compression. Typically, gain expansion and compression may cause the bias current to increase. The bias current to each stage tends to increase with an increase the RF signal power at the input of that stage. This phenomenon is referred to as "current pump-up." The last stage the multi-stage amplifier output, is usually the first to show signs of this current pump-up, and the first stage is usually the last to show signs of current pump-up. In some cases, active biasing the whole die may compensate for current pump-up, but may also limit the output power of the HPA.

In addition, active bias circuits may suffer from slow turn on time and active bias oscillations. Thus, a need exists for an improved system and method for the active biasing of multi-stage amplifiers and/or for reducing the limitation on output power of the multi-stage amplifiers. Furthermore, a need also exists for active biasing that improves settling time and turn on time and improves circuit stability.

SUMMARY OF INVENTION

Systems, devices and methods for multi-stage amplification are provided for actively biasing a multi-stage amplifier. In one exemplary embodiment, a method for differentially actively biasing a multi-stage amplifier comprises the steps of: actively biasing, with a single active bias circuit, an amplifier comprising a plurality of amplification stages; and differentially applying the bias provided by the single active bias circuit by biasing at least one amplification stage at a different bias level than another of the plurality of amplification stages.

In accordance with another exemplary embodiment an active bias circuit for a multi-stage amplifier comprises: a single active bias circuit that is configured to actively bias a plurality of amplification stages via at least two gates; and a differential device configured to cause the active biasing provided to one gate to be different from the bias provided to another gate. Furthermore, a stabilizing resistor may be configured to reduce active bias oscillations and/or improve turn on time.

BRIEF DESCRIPTION OF THE DRAWINGS

These and other features, aspects and advantages of the present invention will become better understood with reference to the following description, appending claims, and accompanying drawings where:

DETAILED DESCRIPTION

In accordance with exemplary embodiments of the present invention, active bias systems, devices, and methods are provided for differentially biasing stages of a multi-stage amplifier. In particular, the system, methods and devices may be configured to bias early stages at a higher voltage level than later stages of a multi-stage amplifier. In accordance with another exemplary embodiment of the present invention, bias from a single active bias circuit is provided in a differential manner to gates of a multi-stage amplifier. The following descriptions are not intended as a limitation on the use or applicability of the invention, but instead are provided merely to enable a full and complete description of exemplary embodiments.

Figures 1, 3:
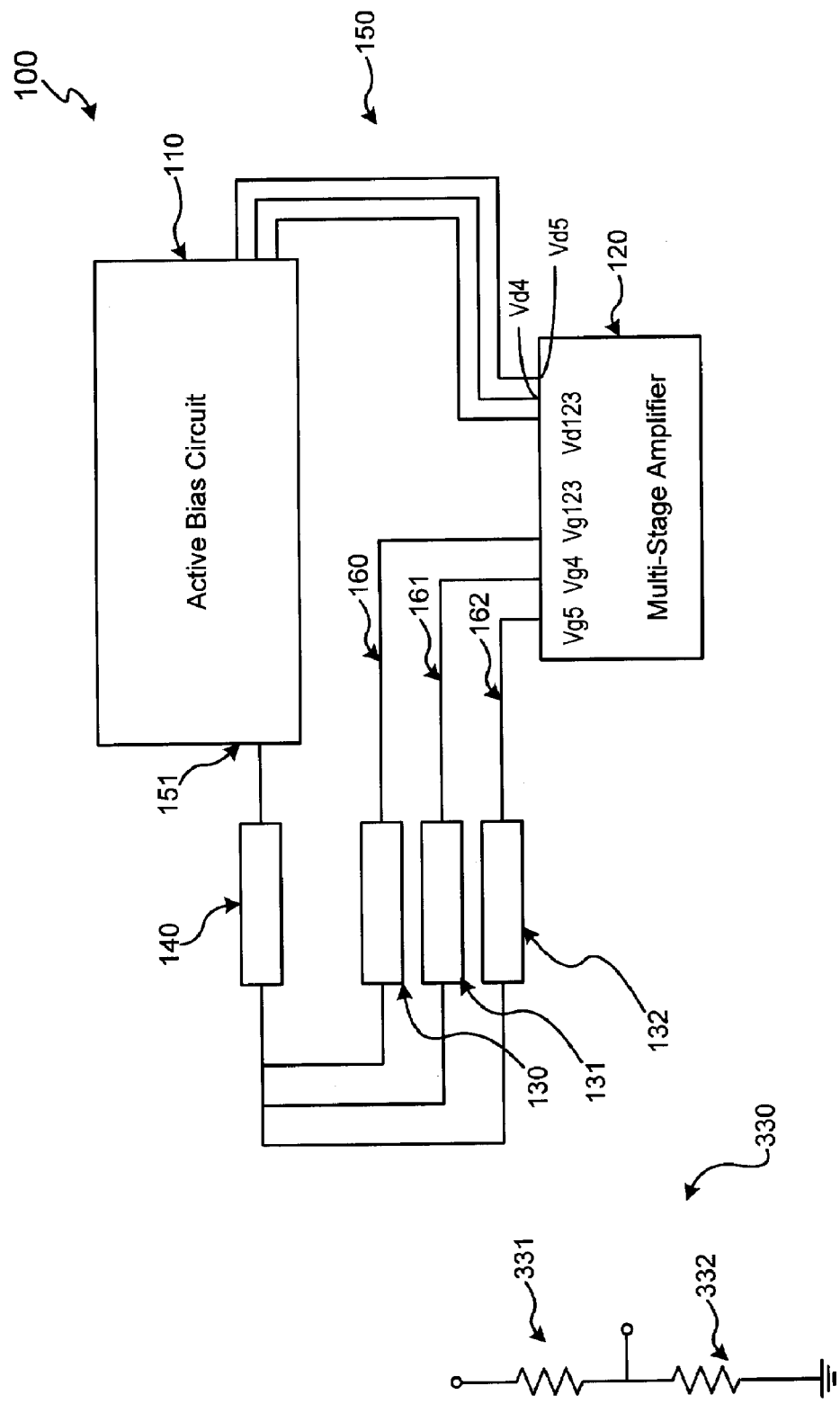
FIG. 1 illustrates, in block format, an exemplary multi-stage amplifier and associated active bias circuitry in accordance with various embodiments of the present invention.
FIG. 3 illustrates an exemplary resistive voltage divider circuit.

In accordance with an exemplary embodiment of the present invention, and with reference now to FIG. 1, an active differential bias system 100 may include: an active bias circuit 110, a multi-stage amplifier 120, a differential device 130, and two or more bias lines 150. In this exemplary embodiment, active bias circuit 110 is electrically connected to multi-stage amplifier 120 via bias lines 150.

Furthermore, differential device 130 may be electrically connected in-between active bias circuit 110 and multi-stage amplifier 120 where one or more of bias lines 150 include differential device 130.

In accordance with one exemplary embodiment, multi-stage amplifier 120 is an amplifier configured to amplify an input signal using two or more stages to create an amplified output signal. For example, an amplifier may receive a 10 dbm input and provide a 35 dbm output. However, other signal gain levels, input levels, and/or output levels may also be associated with various embodiments of the present invention. Although multi-stage amplifier 120 is frequently described herein as being configured to amplify an RF signal, multi-stage amplifier 120 may be configured to amplify other types of signals. For example, multi-stage amplifier 120 may be configured to amplify microwave signals, millimeter wave signals, and/or the like. By way of further example, multi-stage amplifier 120 may also be configured to amplify signals from approximately 500 MHz through about 100 GHz. Furthermore, although multi-stage amplifier 120 is frequently described herein as a high-power amplifier ("HPA"), multi-stage amplifier 120 may be any type of multi-stage amplifier. For example, multi-stage amplifier 120 may be a low-noise amplifier, traveling wave amplifier, and/or the like.

Amplifier 120 may, for example, be fabricated on any suitable MIMIC substrate (i.e., chip, die) of a suitable semiconductor material such as silicon (Si), gallium arsenide (GaAs), germanium (Ge), indium phosphide (InP), and combinations such as mixed silicon and germanium, mixed silicon and carbon, and/or the like.

Multi-stage amplifier 120 may comprise two or more stages. Each stage may be configured to include one or more devices that are powered, at least in part, by a bias voltage. Although various devices may be used in each amplifier stage, in one exemplary embodiment, the device(s) of each stage include Pseudomorphic High Electron Mobility Transistors (PHEMTs). An amplifier stage device may also comprise field effect transistors (FETs), bipolar junction transistors (BJTs), heterojunction bipolar transistors (HBTs), metal semiconductor field effect transistors (MESFETs), metamorphic high electron mobility transistors (mHEMTs), and/or the like.

In one exemplary embodiment, multi-stage amplifier 120 is a MMIC high power amplifier. It should be appreciated that the number of stages, as well as the number of transitions making up each stage can vary depending upon the power drive needed for a particular application. Each stage receives gate bias and drain bias (or the equivalent if FETs are not used) from gate bias circuitry and drain bias circuitry, respectively.

Thus, in one exemplary embodiment, each stage of multi-stage amplifier 120 comprises at least one transistor device. With reference to PHEMTs, the transistor devices may comprise gates and drains. Multi-stage amplifier 120 may further be configured with pins (or other connection points) that are configured to be electrically connected to bias lines 150. In one embodiment, each gate of each transistor device is connected to a single pin. In another embodiment, two or more gates from respective transistor devices are connected to a single pin.

Figure 2:
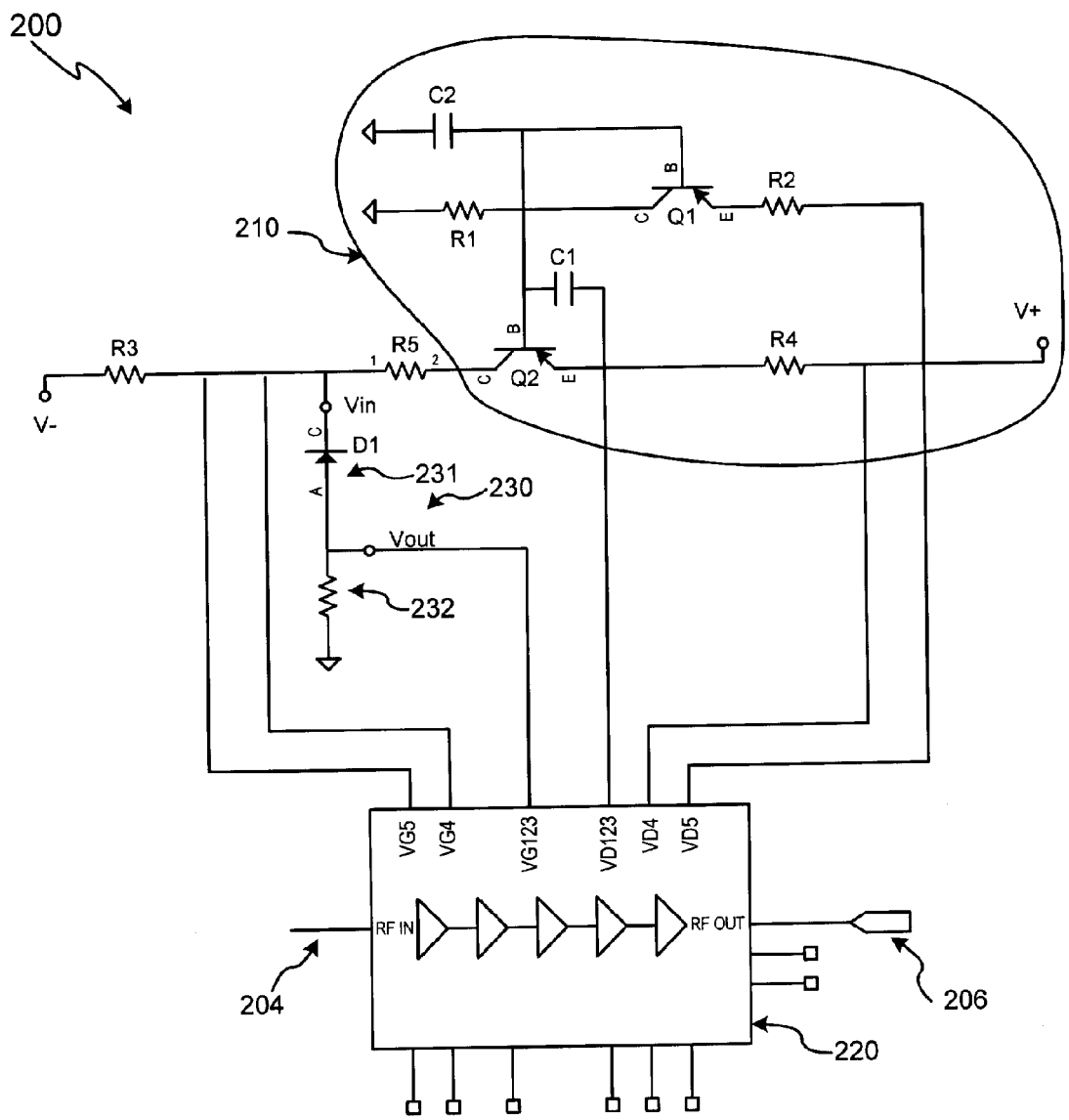
FIG. 2 illustrates another exemplary multi-stage amplifier and associated active bias circuitry in accordance with various embodiments of the present invention.

With reference now to FIG. 2, and in accordance with one embodiment of the invention, a multi-stage amplifier 220 is illustrated. An RF signal at an input port 204 of multi-stage amplifier 220 is amplified by the multiple stages. The output of the final amplification stage is provided at an output port 206. Multi-stage amplifier 220 may, for example, comprise PHEMTs. For example, the gates of stages 1, 2, and 3 are connected to pin Vg123, the gate of stage 4 is connected to Vg4, the drains of stages 1, 2, and 3 are connected to pin Vd123, the drain of stage 4 is connected to Vd4, and so on. The pins of multi-stage amplifier 120 are configured to be connected to bias lines 150 and to provide bias power received from active bias circuit 110 to the transistor devices of the stages within multi-stage amplifier 120.

In accordance with another exemplary embodiment of the present invention, multi-stage amplifier 120 may comprise BJTs. For example, and with reference now to FIG. 4, a multi-stage amplifier 420 may be a 3-stage BJT or HBT amplifier. In this exemplary embodiment, stage 1 comprises a base that is electrically connected to VB1 and a collector VC1. Similarly, stages 2 and 3 may comprise bases and collectors that are respectively electrically connected to VB2/VB3 and VC2/VC3.

In accordance with an exemplary embodiment of the present invention, active bias circuit 110 is configured to provide power to the transistor devices of multi-stage amplifier 120. More specifically, active bias circuit 110 is configured to provide bias voltage to the gates of the transistor devices of multi-stage amplifier 120. In one exemplary embodiment, active bias circuit 110 is configured to provide bias voltage to the pins labeled Vg in FIG. 1. Active bias circuit 110 is also configured to control the current to the drain of the transistor devices of multi-stage amplifier 120, e.g., to the pins labeled Vd in FIG. 1. For example, the current to pin Vd123 is controlled by adjusting the voltage at pin Vg123.

Figure 4:
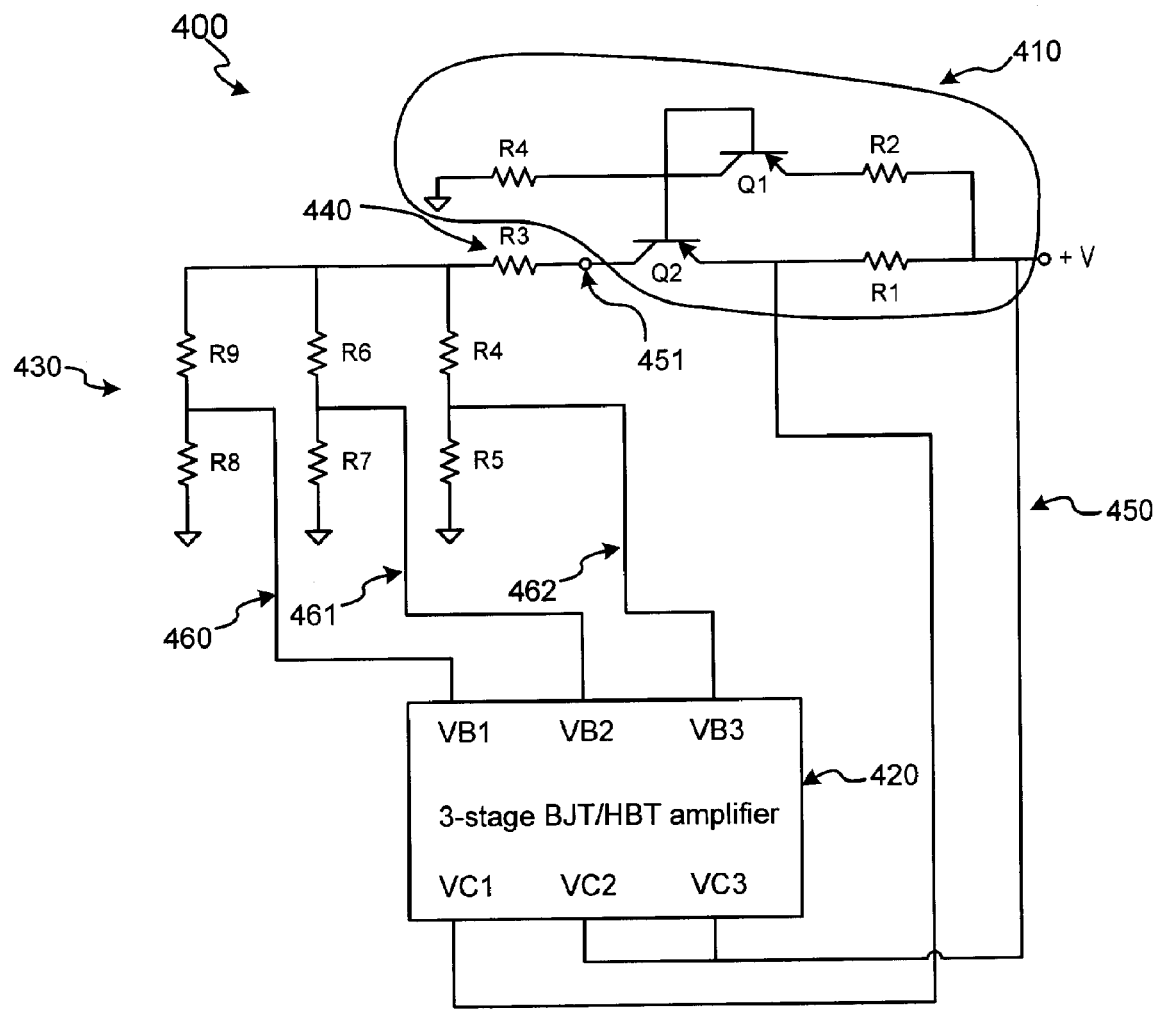
FIG. 4 illustrates yet another exemplary multi-stage amplifier and associated active bias circuitry in accordance with various embodiments of the present invention.

Similarly, with continued reference to FIG. 4, active bias circuit 410 is configured to provide bias voltage to the transistor devices of multi-stage amplifier 420. For example, active bias voltage 410 is configured to provide bias voltage to the pins labeled VB in FIG. 4. Active bias circuit 410 may also be configured to control the current to the collector of the transistor devices of multi-stage amplifier 420, e.g., to the pins labeled VC in FIG. 4.

In accordance with various exemplary embodiments of the present invention, active bias circuit 110 may comprise any circuit that is configured to actively bias transistors and/or control current to the drains of transistors. For example, and with reference to FIG. 2, active differential bias system 200 may comprise a 'two BJT' type circuit 210. In other embodiments, a two FET type active bias circuit may be used. Furthermore, active bias circuit 110 may be formed using operational amplifiers. In accordance with various exemplary embodiments, other types of circuits may suitably be configured to provide active biasing.

Furthermore, active bias circuit 110 may be configured such that a single active bias circuit 110 may be connected to multiple gates/drains, bases/collectors, and/or the like. However, in other exemplary embodiments, two or more single active bias circuit's may be used, where each active bias circuit may be connected to multiple gates/drains, bases/collectors, and/or the like.

In one exemplary embodiment, the active bias circuit (e.g., 110, 210, 410) is configured to provide a single output bias voltage at the active bias circuit output (e.g., 151, 251, 451). This single output bias voltage may be communicated over the bias lines (e.g., 150, 250, 450) to the multi-stage amplifier (e.g., 120, 220, 420). The single output bias voltage may be applied to more than one pin of the multi-stage amplifier. For example, bias lines 150 may comprise three gate bias lines (e.g. 160, 161, 162). The three gate bias lines may be connected to active bias circuit output 151 on one end and on the other ends to multi-stage amplifier 120 at, for example pins Vg123, Vg4, and Vg5, respectively. Similarly, with reference to FIG. 4, differential bias system 400 may comprise bias lines 450 that may further comprise 3 base bias lines (e.g. 460, 461, 462).

A bias line may be configured to provide bias to the gates/bases of one or more transistors. For example, gate bias line 160 may provide bias voltage to the gates of transistors in stages 1, 2, and 3; gate bias line 161 may provide bias voltage to the gates of the transistor(s) in stage 4; and gate bias line 162 may be configured to provide bias voltage to the gates of the transistor(s) in stage 5. Similarly, a base bias line may be configured to bias the base of, for example, BJT type transistors. For example, base bias line 460 may be configured to provide bias voltage to the base of transistor(s) in stage 1; base bias line 461 may be configured to provide bias voltage to the base of stage 2 transistor(s); and base bias line 462 may provide bias voltage to the base of transistor(s) in stage 3.

As described thus far, active bias circuit 110 is connected to multi-stage amplifier 120 in such a manner that the same bias is applied to each transistor at each stage. Furthermore, and for this reason, the current to each drain is commonly controlled. However, in accordance with one exemplary embodiment of the present invention, active differential bias system 100 further comprises differential device 130. Differential device 130 may be suitably configured to differentially bias two or more stages of multi-stage amplifier 120. For example, one or more gates, bases, etc., may be differentially biased from stage to stage. Stated another way, differential device 130 may comprise any device or combination of components that are configured to change the magnitude of the voltage bias as between one stage and at least one other stage of multi-stage amplifier 120.

Furthermore, differential device 130 may be configured to change the voltage bias as between the input and the output of differential device 130. Differential device 130 may, for example, comprise an input and an output and be configured such that the voltage at the output of differential device 130 is different from the voltage applied at its input. For example, differential device 130 may be configured to reduce (or increase) its output voltage in comparison to its input voltage.

In accordance with one exemplary embodiment, and with reference to FIG. 3, differential device 130 comprises a resistor voltage divider network 330. Resistor voltage divider circuits 330, for example, may be configured to reduce the input voltage based on a resistor ratio (e.g., 331, 332). For example, resistor voltage divider may create a voltage drop of 0.2V or any other suitable voltage level drop. A resistor voltage divider circuit may be suitable for use, for example, on relatively lower power amplifiers such as amplifiers in the ±10 dim range.

In accordance with another exemplary embodiment, and with reference to FIG. 4, differential device 430 similarly comprises a resistor voltage divider network. In this exemplary embodiment, each of the bias lines 460–462 are associated with a differential device 430. For example, bias line 460 comprises a differential device with resistors R8 and R9, bias line 461 is associated with R7/R6, and bias line 462 is associated with R4/R5. However, in other embodiments, less than all of the bias lines to the stages of multi-stage amplifier 420 comprise a differential device 430.

In another exemplary embodiment, and with reference to FIG. 2, differential device 130 comprises a divider network 230. Divider network 230 may comprise a diode ("D1") 231 and a resistor 232. The divider network is similarly configured to create a suitable voltage drop (e.g., 0.2 Volts). Diode 231 may comprise ends A and C. Diode end A is suitably in electrical communication with node 2 of resistor 232 and the other node of resistor 232, node 1, is connected to ground. Node 2 of resistor R6, also known as Vout for differential device 130, is also connected to Vg123. In this embodiment, diode 231 end C is configured to receive the same bias as Vg4 and Vg5. For example, diode end C is in electrical communication with the collector of transistor Q2 and with pins Vg4 and Vg5.

As mentioned before, when the RF input power to an amplifier stage is large enough to cause the amplifier to operate in a compression mode, the amplifier typically draws an increased bias current. This increased current may tend to cause the bias voltage output from a resistor divider to change and thus perturb the bias. In accordance with exemplary embodiments of the present invention, a diode/resistor voltage divider may be advantageous over a resistor/resistor voltage divider because it tends to draw less current and may have a lower voltage change for a set current increase. The forward voltage drop Vf change of the diode for a given current change on the first stages may be much less than the voltage drop across a similarly situated resistor. Furthermore, use of a diode type resistor divider may be advantageous in high power amplifiers. The diode type resistor divider may tend to be less susceptible to non-linearities, which may arise through use of a resistor when the current from the gates vary. Thus, the active bias circuit may be configured to produce a voltage at Vg123, where Vg123 is equal to the active bias voltage provided to differential device 230 minus Vf.

Thus, differential device 130 may comprise any suitable device that is configured to cause the voltage applied via one bias line to be different from that applied via one of the other bias lines. For example, where a common voltage would otherwise be applied, in one exemplary embodiment, differential device 130 causes a bias voltage of –0.5 V to be applied at Vg123, compared to a bias voltage of –0.7 V that is applied at Vg4 and Vg5. Thus, in this example, Vg123 is biased higher than Vg4 and Vg5, i.e., stages 1, 2, and 3 are biased higher on the Vg-Id curve than stages 4 and 5.

In accordance with various exemplary embodiments, one, two, three, or more bias lines may each be configured to connect active bias circuit 110 with multi-stage amplifier 120 through a differential device 130. In this manner, active differential bias system 100 may be configured to cause differential biasing as between various bias lines. Similarly, with reference to FIG. 4, a differential bias system 400 comprises differential devices 430 on one or more of the bias lines (e.g., 460, 461, 462). Thus, system 100 is suitably configured to differentially bias two or more stages at two or more voltage levels.

In accordance with yet another aspect of the present invention, active differential bias system 100 may be further configured to reduce active bias loop oscillations. For example, system 100 may comprise a stability resistor 140 (see also, stability resistor 440 of differential bias system 400). Stability resistor 140 may be electrically connected to the output bias voltage at active bias circuit output 151 on one end and to gate pins for various stages of multi-stage amplifier 120 at the other end. Stability resistor 140 may be suitably located in active differential bias system 100 such that all of the bias power that is applied to the stages of multi-stage amplifier 120 first passes through stability resistor 140. In one exemplary embodiment, bias feed lines 150 may be considered as being arranged in loops. For example, an inner loop follows the path from active bias circuit 110, through stability resistor 140, differential device 130, Vg123 pin, Vd123 pin, and back to active bias circuit 110. A second loop follows the path from active bias circuit 110, through stability resistor 140, differential device 131 (optional), Vg4 pin, Vd4 pin, and back to active bias circuit 110. An outer loop follows the path from active bias circuit 110, through stability resistor 140, differential device 132 (optional), Vg5 pin, Vd5 pin, and back to active bias circuit 110. It is noted that each loop includes stability resistor 140.

With reference to FIG. 2, stability resistor R5 has two ends, e.g., R5 pin 1 and R5 pin 2. R5 pin 2 is electrically connected to the Q2 collector pin. R5 pin 1 is connected to Vg5 and Vg4 pins of multi-stage amplifier 220 as well as to pin C of diode D1, which is otherwise known as Vin of differential device 130. The other end of diode D1, pin A, is electrically connected to Vg123 pin of multi-stage amplifier 220 and to ground across resistor 232. The drains of multi-stage amplifier 220 are electrically connected back to active bias circuit 210, which includes Q2. Thus, as illustrated in FIG. 2, stability resistor R5 may be configured to be in the path of each bias feed loop.

Described in another way, a resistor R5 may be placed between Q2 collector and all of the gates Vg123, Vg4 and Vg5. Resistor R5 may be configured to provide higher impedance to the active bias loops. For example, resistor R5 may be configured to raise the impedance of inner loop Q2 C, R5 pin2, R5 pin1, D1 C, D1 A, Vg123, Vd123, Q2 E. Resistor R5 may also be configured to raise the impedance of outer loop1: Q2 C, R5 pin2, R5 pin1, Vg4, Vd4, R4 pin2, R4 pin1, Q2 E. Resistor R5 may also be configured to raise the impedance of outer loop2: Q2 C, R5 pin2, R5 pin1, Vg5, Vd5, R4 pin2, R4 pin1, Q2 E.

Stability resistor 140 may be 100Ω, and resistor 232 may be 499Ω. However, other sizes of resistors may suitably be used depending on the devices, their arrangement, and performance of the system.

Furthermore, stability resistor 140 may tend to reduce active bias oscillations and/or improve loop stability of the active bias circuit during device "turn on". For example, turn on time has been found to be greatly improved by adding a resistor off the collector of active bias transistor Q2. In one experiment, a turn on time of about 140 μS, is improved to less than 10 μS by the addition of stability resistor 140.

In accordance with further exemplary embodiments of the present invention, a capacitor may be added to remove gain that might otherwise occur in the active bias circuitry. For example, and with reference to FIG. 2, a capacitor C2 may be added between ground and the base/collector of transistor Q1. Capacitor C2 may also be electrically connected between the emitter and the base of transistor Q2. Capacitors C1 and C2 may be configured to reduce active bias loop oscillation. Capacitors C1 and C2 may, for example, be 1 μF 50V capacitors. However, other sizes of capacitors may suitably be used that tend to reduce active bias loop oscillation.

Conventional wisdom is that the addition of such capacitors may negatively effect the turn on time. However, with the addition of stability resistor R5, capacitors C1 and C2 may be appropriately sized to reduce active bias loop oscillation while still achieving desired turn on time.

In accordance with various exemplary embodiments of the present invention, a method is provided for actively biasing the stages of a multiple stage amplifier in a differential manner. The method includes, for example, the steps of biasing the one stage of a multiple stage amplifier at one voltage level, and biasing at least one of the other stages at a different voltage level. In another example, the method includes the steps of biasing the latter stages of a multiple stage amplifier at one voltage level, and biasing the first stages at a higher gate voltage. Thus, the first stages are biased higher than the rest of the stages. In yet further exemplary embodiments, one or more early stages may be biased higher (i.e., the stage(s) has a higher drain current with respect to its nominal quiescent current) than one or more later stages.

In one exemplary embodiment, differential biasing may include the reduction of voltage provided to one of the stages. The voltage may be reduced using a resistor divider, a diode type voltage divider, and/or the like. Differential biasing may further involve reducing voltage to more than one stage and/or to more than one group of stages. For example, FIG. 1 illustrates three differential devices (e.g. 130, 131, 132) that may be configured to provide differential biasing of stages 123, stage 4 and stage 5.

In accordance with various aspects of the present invention, the systems and methods for differentially biasing multiple stages of a RF amplifier facilitate improved power amplification. By way of comparison with similar multi-stage amplification devices that do not provide differential biasing ("non-differential biasing"), the present invention tends to facilitate improved power output and/or reduced energy consumption.

For example, in non-differential biasing, typically the current of the whole die is increased in order to produce the desired power output. This results in a relatively large current flow to the amplifier. However, by biasing the first stage a little higher than later stages, the total current to the die may be lower than the total current to a die in a non-differential biasing embodiment, while still producing the same amount of power output. In one exemplary embodiment, as between differential biasing and a non-differential biasing of a multi-stage amplifier, during quiescent operation, a 10% reduction in bias current may be achieved with no difference in output power. Although the current may be increased slightly to the early stages, a relatively large decrease in current to the later stages may be achieved, thus facilitating an overall reduction in bias current.

Furthermore, biasing the first stage a little higher than later stages allows the later stages to pump up. This may tend to increase output power when compared to a circuit where the whole die is active biased non-differentially. This may also tend to provide similar output power compared to a non-differentially active biased die, but do so with less quiescent current (i.e., the current consumed by the die with no RF applied).

Differential biasing may facilitate a reduction in the amount of current regulation performed by the active bias circuit. Under differential biasing, there may still be some change in gate voltage on the first stages to compensate for regulating the current, but this may be compensated for by increasing the current to the first stages. If the current to the first stages is slightly increased above its normal quiescent current, then the total change in bias current supplied to the amplifier, during a power sweep, may be relatively small compared to a similarly situated amplifier that is not differentially biased. Thus, differential biasing may facilitate allowing the output stage to compress without the active bias trying to shut the latter stages off.

Furthermore, in accordance with another aspect of the present invention, use of stability resistor R5 and/or capacitor(s) C1 and C2 may facilitate a 90% reduction in turn on time over circuits without one or more of these devices. These devices tend to reduce active bias oscillations. Furthermore, stability resistor R5 may tend to reduce the number of capacitors used for maintaining loop stability.

It should be appreciated that the particular implementations shown and described herein are illustrative of various embodiments of the invention including its best mode, and are not intended to limit the scope of the present invention in any way. For example, the systems, devices, and methods for active bias circuitry described herein were described with respect to FETs, however various other active devices may be equally as suitable. For the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

While the principles of the invention have now been made clear in illustrative embodiments, there will be immediately obvious to those skilled in the art many modifications of structure, arrangements, proportions, the elements, materials and components, used in the practice of the invention that are particularly adapted for a specific environment and operating requirements without departing from those principles. These and other changes or modifications are intended to be included within the scope of the present invention, as expressed in the following claims.

What is claimed is:

1. A system for actively biasing a multi-stage RF amplifier comprising:
   a single active bias circuit that is configured to actively bias a plurality of RF amplification stages; and
   a differential device configured to cause the bias provided to one of said plurality of amplification stages to be different from the bias provided to another of said plurality of amplification stages, wherein each of said plurality of RF amplification stages comprise a transistor device having at least two terminals, and wherein said at least two terminals are electrically connected to said active bias circuit such that feedback is provided between said at least two terminals.

2. The active bias system of claim 1, wherein said multi-stage RF amplifier is a high-power amplifier, and wherein said active bias circuit is configured to provide a constant current to a first stage of said plurality of RF amplification stages while permitting current to vary in at least one subsequent stage of said plurality of RF amplification stages.

3. The active bias system of claim 1, wherein said differential device comprises a resistor voltage divider.

4. The active bias system of claim 1, wherein said differential device comprises a diode type voltage divider.

5. The active bias system of claim 1, further comprising:
   an inner loop bias path, wherein said inner loop bias path comprises an electrical connection from an active bias circuit to a first terminal of a first transistor of a first amplifier stage, and an electrical connection from a second terminal of said first transistor of said first amplifier stage to said active bias circuit;
   an outer loop bias path, wherein said outer loop bias path comprises an electrical connection from said active bias circuit to a third terminal of a second transistor of a second amplifier stage that is subsequent to said first amplifier stage, and an electrical connection from a fourth terminal of said second transistor of said second amplifier stage to said active bias circuit, wherein said inner loop and outer loop bias paths are configured to electrically connect an active bias circuit to a multi-stage amplifier, and wherein said outer loop bias path is configured to differentially bias at least some of the amplification stages of said active bias system; and
   a stabilization resistor, wherein said stabilization resistor is in a shared portion of the path of said inner loop and outer loop bias paths, and wherein said active bias circuit is configured to control the bias to said multi-stage RF amplifier to maintain a constant current in said inner loop bias path, and wherein said active bias circuit is configured to permit the current to vary in said outer loop bias path.

6. The active bias system of claim 4, further comprising a capacitor for facilitating stabilization of said active bias circuit.

7. A method of actively biasing a multi-stage RF amplifier comprising the steps of:
   actively biasing, with a single active bias circuit an RF amplifier comprising a plurality of amplification stages, wherein said single active bias circuit is configured to create a single active bias voltage level output, wherein each of said plurality of amplification stages comprises at least one transistor, wherein each transistor comprises at least a first control terminal and a second control terminal; and
   differentially applying the bias provided by said single active bias circuit; wherein said step of differentially applying the bias further involves biasing at least one of said plurality of amplification stages at a different bias voltage level than another of said plurality of amplification stages, and
   providing feedback to said active bias circuit for controlling a constant current to at least a first stage of said multi-stage RF amplifier, wherein said first control terminal is electrically connected to said active bias circuit for providing a bias voltage to said at least one transistor, and wherein said second control terminal is electrically connected to said active bias circuit to provide feedback to said active bias circuit.

8. The method of claim 7, wherein said multistage RF amplifier comprises a high-power RF amplifier, and wherein said active bias circuit provides a stable quiescent operating current to at least said first stage of said multi-stage RF amplifier and wherein said multistage RF amplifier is configured to allow current and power pump-up in a subsequent stage of said multi-stage RF amplifier.

9. The method of claim 8, wherein said plurality of amplification stages comprises first stages and later stages, and wherein said first stages are biased at a higher voltage level than said later stages.

10. The method of claim 8, wherein said differential biasing further comprises reducing the voltage level of said single active bias voltage level output to form a reduced bias level, and biasing at least one of said plurality of amplification stages with said reduced bias level.

11. The method of claim 10, wherein said reducing step further comprises voltage division using a diode type voltage divider.

12. The method of claim 10, wherein said reducing step further comprises voltage division using a resistor type voltage divider.

13. The method of claim 9, further comprising the step of stabilizing the bias power, wherein said stabilizing includes adding a resistor within a shared portion of the path of an inner loop and an outer loop from the active bias circuit to the multi-stage amplifier;

wherein said inner loop bias path comprises an electrical connection from said active bias circuit to said first control terminal of a first transistor of a first amplifier stage, and an electrical connection from said second control terminal of said first transistor of said first amplifier stage to said active bias circuit; and wherein said outer loop bias path comprises an electrical connection from said active bias circuit to a third terminal of a second transistor of a second amplifier stage that is subsequent to said first amplifier stage, and an electrical connection from a fourth terminal of said second transistor of said second amplifier stage to said active bias circuit.

14. A high-power RF amplifier system comprising:

a high-power RF amplifier comprising a plurality of amplifier stages, wherein each amplifier stage of said plurality of amplifier stages comprises at least one transistor;

an active bias circuit configured to provide a single bias output; wherein said active bias circuit is electrically connected to each amplifier stage;

a differential device, wherein said differential device is configured to receive said single bias output from said active bias circuit, is configured to reduce the voltage level of the received single bias output to form a reduced bias, and is configured to provide said reduced bias to at least one, but not all, of said plurality of amplifier stages;

each of said at least one transistor further comprising at least a first terminal and a second terminal, wherein said active bias circuit is electrically connected to said first terminal, and wherein said active bias circuit is electrically connected to said second terminal.

15. The high-power RF amplifier system of claim 14, wherein said differential device comprises a resistor voltage divider.

16. The high-power RF amplifier system of claim 14, wherein said differential device comprises a diode type voltage divider.

17. The high-power RF amplifier system of claim 14, further comprising:

an inner loop bias path, wherein said inner loop bias path comprises an electrical connection from said active bias circuit to said first terminal of a first transistor of a first amplifier stage, and an electrical connection from said second terminal of said first transistor of said first amplifier stage to said active bias circuit, wherein said system is configured to provide a stable quiescent operating current to said inner loop bias path;

an outer loop bias path, wherein said outer loop bias path comprises an electrical connection from said active bias circuit to a third terminal of a first transistor of a second amplifier stage that is subsequent to said first amplifier stage, and an electrical connection from a fourth terminal of said first transistor of said second amplifier stage to said active bias circuit; wherein said inner loop and outer loop bias paths are configured to electrically connect an active bias circuit to a multi-stage amplifier, and wherein said system is configured to allow current and power pump-up on a stage of said outer loop bias path; and a stabilization resistor, wherein said stabilization resistor is in the path of said inner loop and outer loop bias paths.

18. A high power RF amplifier comprising:

a multistage amplifier comprising at least a first amplifier stage and a second amplifier stage, said first amplifier stage further comprising at least a first transistor, ,said second amplifier stage further comprising at least a second transistor, said first transistor further comprising at least a first terminal and a second terminal, and said second transistor further comprising at least a third terminal and a fourth terminal;

an active bias circuit configured to provide a bias voltage to said first terminal of said first transistor and to said third terminal of said second transistor; said active bias circuit further configured to be electrically connected to said second and fourth terminals; and wherein said active bias circuit provides a feedback between (a) said first and third terminals collectively and (b) said second and fourth terminals collectively;

a differential device, electrically connected between said active bias circuit and said multistage amplifier, said differential device configured to cause the bias voltage provided to said first amplifier stage to be different from the bias voltage provided to said second amplifier stage.

19. The high power amplifier of claim 18, wherein said active bias circuit is configured to actively change the bias voltage to maintain a constant current to said first stage and wherein said high power RF amplifier is further configured to permit current and power pump-up in at least one stage of said multi-stage amplifier.

\* \* \* \* \*

UNITED STATES PATENT AND TRADEMARK OFFICE
CERTIFICATE OF CORRECTION

| | |
|---|---|
| PATENT NO. | : 7,180,367 B2 |
| APPLICATION NO. | : 10/905522 |
| DATED | : February 20, 2007 |
| INVENTOR(S) | : Charles Woods et al. |

It is certified that error appears in the above-identified patent and that said Letters Patent is hereby corrected as shown below:

Col. 10 lines 20-44

Claim 7 should read as follows (with underlining and bold showing items the Office incorrectly omitted, i.e. a comma on line 2 after the words "active bias circuit"):

7. A method of actively biasing a multi-stage RF amplifier comprising the steps of:

actively biasing, with a single active bias circuit, an RF amplifier comprising a plurality of amplification stages, wherein said single active bias circuit is configured to create a single active bias voltage level output, wherein each of said plurality of amplification stages comprises at least one transistor, wherein each transistor comprises at least a first control terminal and a second control terminal; and differentially applying the bias provided by said single active bias circuit; wherein said step of differentially applying the bias further involves biasing at least one of said plurality of amplification stages at a different bias voltage level than another of said plurality of amplification stages, and providing feedback to said active bias circuit for controlling a constant current to at least a first stage of said multi-stage RF amplifier, wherein said first control terminal is electrically connected to said active bias circuit for providing a bias voltage to said at least one transistor, and wherein said second control terminal is electrically connected to said active bias circuit to provide feedback to said active bias circuit.

UNITED STATES PATENT AND TRADEMARK OFFICE
CERTIFICATE OF CORRECTION

| | |
|---|---|
| PATENT NO. | : 7,180,367 B2 |
| APPLICATION NO. | : 10/905522 |
| DATED | : February 20, 2007 |
| INVENTOR(S) | : Charles Woods et al. |

It is certified that error appears in the above-identified patent and that said Letters Patent is hereby corrected as shown below:

Col. 12 lines 19-41

Claim 18 should read as follows (with double brackets showing material incorrectly added by the office, i.e. an extra comma at line 3):

18. A high power RF amplifier comprising:

a multistage amplifier comprising at least a first amplifier stage and a second amplifier stage, said first amplifier stage further comprising at least a first transistor, [[,]]said second amplifier stage further comprising at least a second transistor, said first transistor further comprising at least a first terminal and a second terminal, and said second transistor further comprising at least a third terminal and a fourth terminal;

an active bias circuit configured to provide a bias voltage to said first terminal of said first transistor and to said third terminal of said second transistor; said active bias circuit further configured to be electrically connected to said second and fourth terminals; and wherein said active bias circuit provides a feedback between (a) said first and third terminals collectively and (b) said second and fourth terminals collectively;

UNITED STATES PATENT AND TRADEMARK OFFICE
CERTIFICATE OF CORRECTION

PATENT NO.       : 7,180,367 B2
APPLICATION NO.  : 10/905522
DATED            : February 20, 2007
INVENTOR(S)      : Charles Woods et al.

It is certified that error appears in the above-identified patent and that said Letters Patent is hereby corrected as shown below:

a differential device, electrically connected between said active bias circuit and said multistage amplifier, said differential device configured to cause the bias voltage provided to said first amplifier stage to be different from the bias voltage provided to said second amplifier stage.

Signed and Sealed this

Fifteenth Day of July, 2008

JON W. DUDAS
*Director of the United States Patent and Trademark Office*